United States Patent
Pullen

(10) Patent No.: US 6,297,693 B1
(45) Date of Patent: Oct. 2, 2001

(54) TECHNIQUES FOR SYNCHRONIZING A SELF OSCILLATING VARIABLE FREQUENCY MODULATOR TO AN EXTERNAL CLOCK

(75) Inventor: Stuart W. Pullen, Raleigh, NC (US)

(73) Assignee: Red Chip Company Limited, Tortola (VG)

( * ) Notice: Subject to any disclaimer, the term of this patent is extended or adjusted under 35 U.S.C. 154(b) by 0 days.

(21) Appl. No.: 09/471,569

(22) Filed: Dec. 23, 1999

(51) Int. Cl.[7] .................................................. H03F 3/38
(52) U.S. Cl. .............................................. 330/10; 330/251
(58) Field of Search .................................. 330/10, 207 A, 330/251; 332/109; 375/238

(56) References Cited

U.S. PATENT DOCUMENTS

| | | | |
|---|---|---|---|
| 4,531,096 | * | 7/1985 | Yokoyama ............................... 330/10 |
| 4,673,889 | * | 6/1987 | Cini et al. ............................... 330/10 |
| 5,115,205 | * | 5/1992 | Holmes, Jr. .......................... 330/251 |
| 5,442,317 | * | 8/1995 | Stengel .................................... 330/10 |
| 5,451,900 | * | 9/1995 | Haga et al. ........................... 330/251 |
| 5,617,058 | * | 4/1997 | Adrian et al. .......................... 330/10 |
| 5,805,020 | * | 9/1998 | Danz et al. ............................. 330/10 |
| 5,973,569 | * | 10/1999 | Nguyen ................................ 330/251 |
| 6,016,075 | * | 1/2000 | Hamo ..................................... 330/10 |
| 6,107,875 | * | 8/2000 | Pullen et al. ............................ 330/10 |
| 6,118,336 | * | 9/2000 | Pullen et al. ............................ 330/10 |

* cited by examiner

*Primary Examiner*—Robert Pascal
*Assistant Examiner*—Khanh Van Nguyen
(74) *Attorney, Agent, or Firm*—Jaeckle Fleischmann & Mugel, LLP

(57) ABSTRACT

The frequency spectrum of variable frequency class D modulator interferes with RF signals in the AM bandwidth. Here several techniques solve the problem including an amplifier that synchronizes an external clock input the summing node of the integrator, an amplifier that gates an external clock to the modulator using a transmission gate that responds to the AM frequency, and an amplifier that adjusts its own hysteresis to provide a clock that does not interfere with AM input signals.

6 Claims, 5 Drawing Sheets

*SELF OSCILLATING VARIABLE FREQUENCY CLASS D AMPLIFIER*

METHODS TO GENERATE A TRIANGLE WAVE FROM
THE LOCAL OSCILLATOR OF AN AM RADIO

*SYNCHRONIZATION TO SQUARE WAVE*

*CONTROLLING FREQUENCY BY CONTROLLING THE HYSTERESIS IN THE COMPARATOR*

TECHNIQUES FOR SYNCHRONIZING A SELF OSCILLATING VARIABLE FREQUENCY MODULATOR TO AN EXTERNAL CLOCK

The frequency spectrum of variable frequency a class D modulator can potentially interfere with many RF signals most notably AM broadcast radio. This limits the use of such modulators to electronic equipment without an AM tuner. However, many customers for audio amplifiers require that the amplifier have an AM receiver. The technique described here overcomes this defect with several techniques which synchronize the class D modulator to an external clock. If the frequency of the external clock is chosen wisely, interference with AM radio signals can be prevented.

BACKGROUND OF THE INVENTION

The performance of class D amplifier can be improved with the use of a self oscillating variable frequency modulator. The most notable advantage is a lower noise floor. The drawback to this approach is that the frequency spectrum of the modulator spans the entire AM band, because the frequency falls as the power output increases—see FIG. 1. Furthermore, the front end bandpass filters used in tuners effectively convert the frequency modulation of a variable frequency modulator into AM modulation, since the amplitude of the interference varies with frequency (slope detection). All of these issues make the modulator in FIG. 1 unacceptable for use with an AM radio. The modulator as shown in FIG. 1 is unacceptable for audio amplification because the frequency transverses the audio range at high powers, and at clipping the control loop opens and the integrator saturates. An improved modulator based on the one in FIG. 1 which limits the frequency above 100 kHz at full power can be found in my co-pending patent application U.S. Ser. No. 09/342,376, filed Jun. 29, 1999, whose entire disclosure is incorporated by reference.

This invention maintains the benefits of self oscillation, and eliminates AM interference by synchronization to an external clock whose frequency is chosen so that it does not interfere with AM reception. The details of how this frequency is chosen are discussed in my co-pending application (U.S. Ser. No. 09/342,376, filed Jun. 29, 1999).

DETAILED DESCRIPTION

Figure 1:
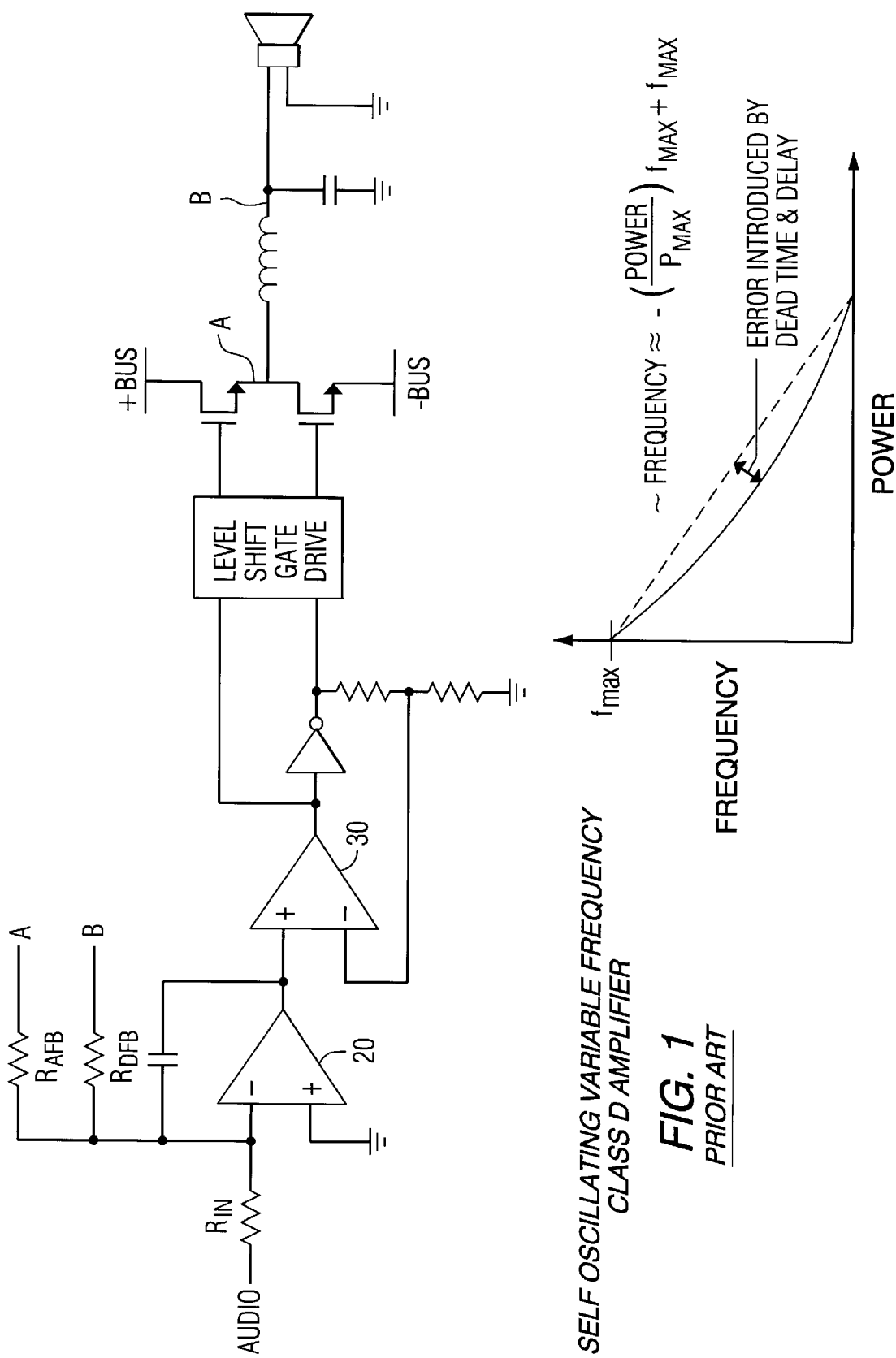
FIG. 1 is a schematic of a self oscillating variable frequency class D modulator.
Figure 2A:
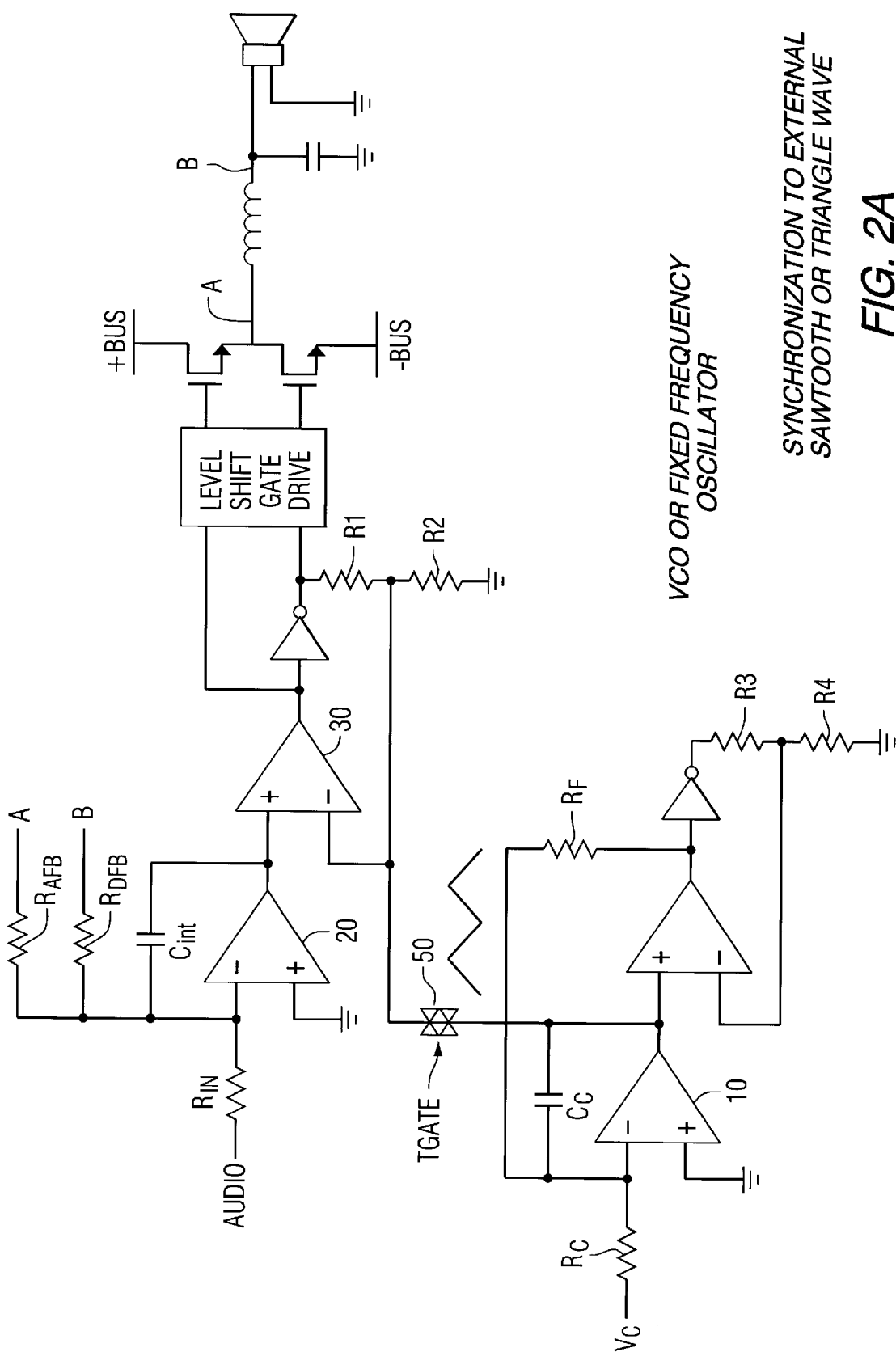
FIG. 2A is a schematic of a self oscillating variable frequency class D modulator synchronized to an external triangle or sawtooth wave.
Figure 2B:
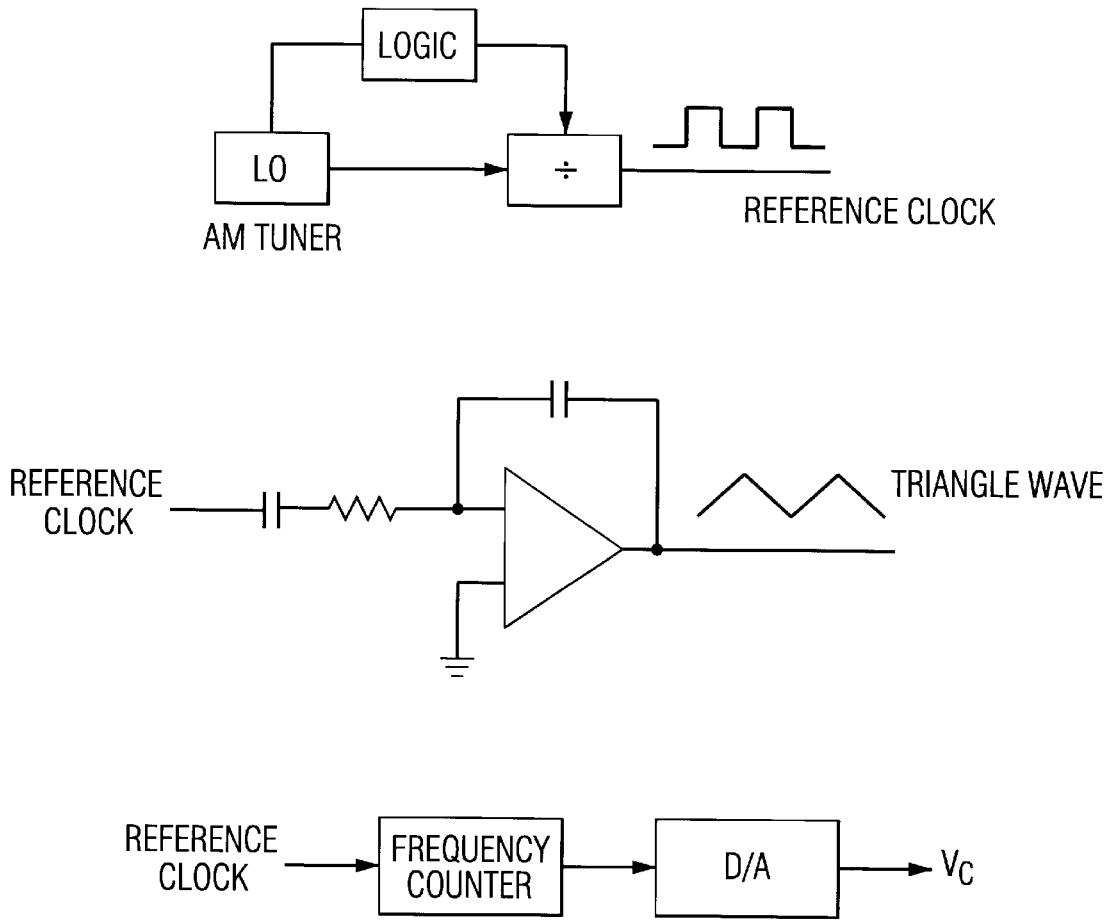
FIG. 2b is a schematic of methods of generating a triangle wave from the local oxidator (LO) of an AM radio.
Figure 3:
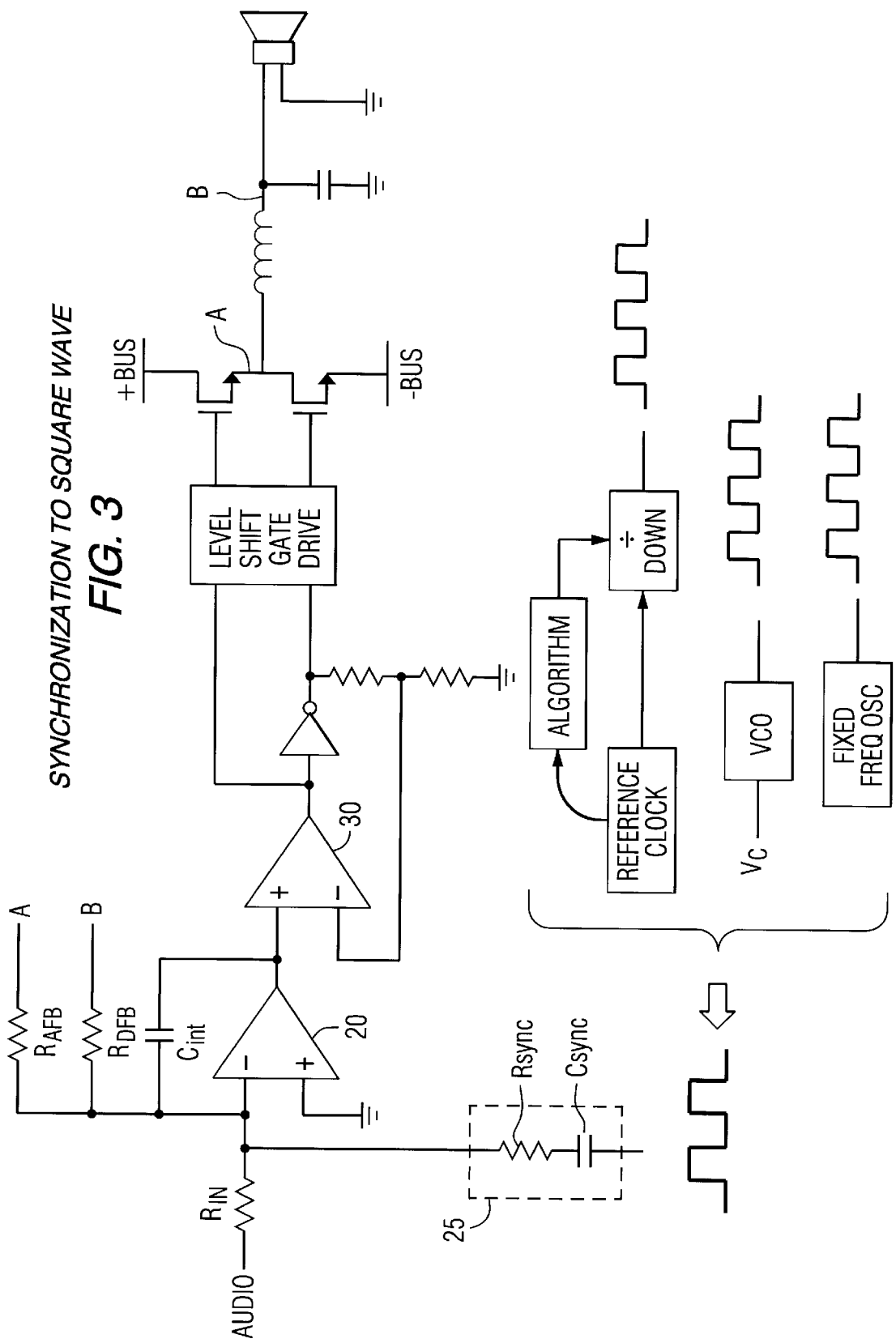
FIG. 3 is a schematic of a self oscillating variable frequency class D modulator synchronized to an external square wave.
Figure 4:
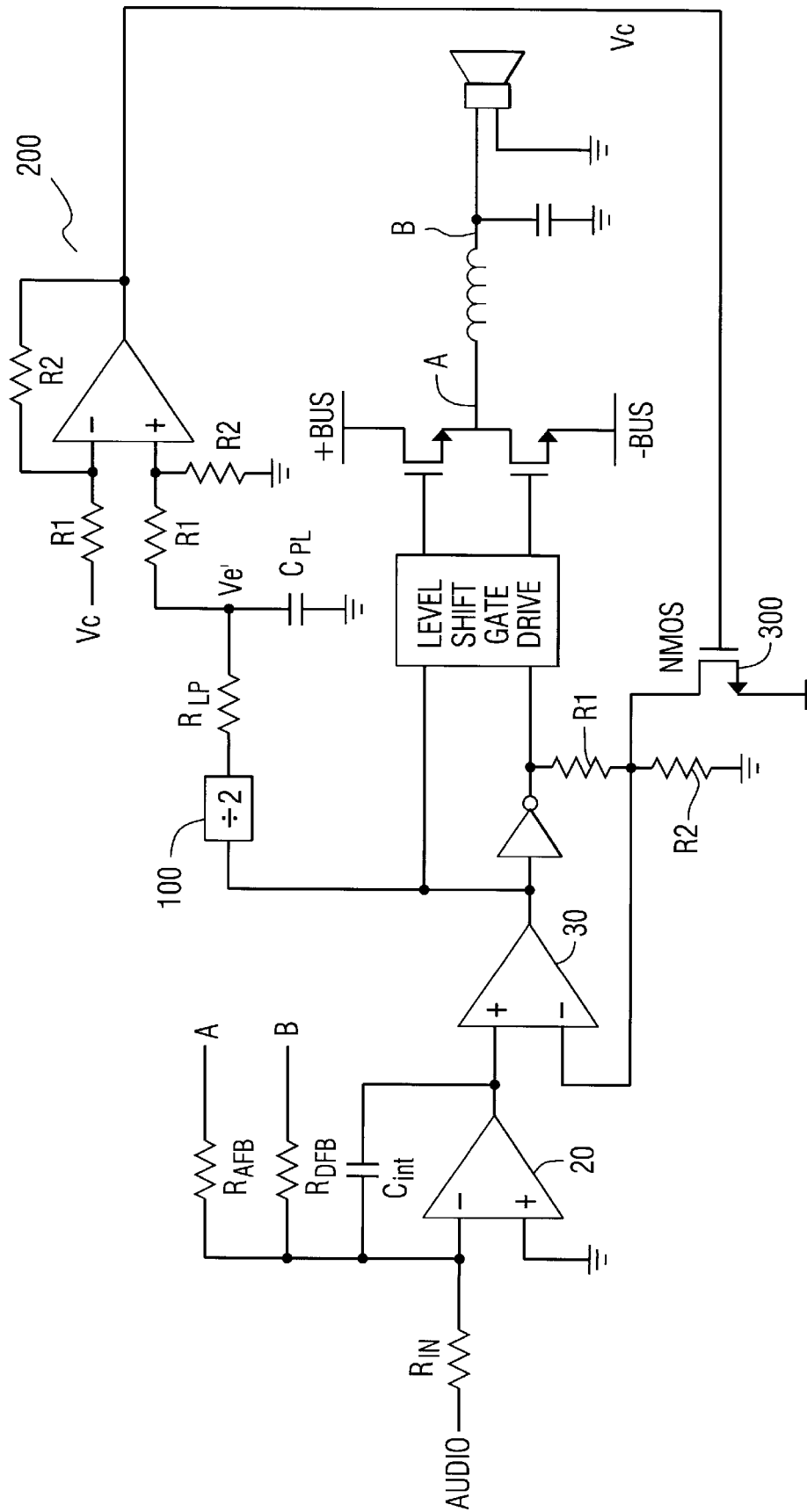
FIG. 4 is a schematic of a self oscillating variable frequency class D modulator synchronized by controlling the hysteresis in the comparator.

FIGS. 2A, 3 and 4 describe three unique ways to synchronize a self oscillating class D amplifier to an external clock. The term "external clock" is used to identify any clock source other than the self-oscillating clock source. FIG. 2 shows how an external triangle wave or sawtooth can by used for synchronization. The added circuit shown is a voltage controlled oscillator (VCO). If Vc is open or grounded, the output of the integrator will be a triangle wave. If a DC control voltage is applied to Vc, then the output of the integrator will be a lower frequency sawtooth. The frequency will decrease to zero when the current through Rc balances the feedback current through Rf. While the circuit shown in FIG. 2A is versatile in that it allows a control frequency to set the modulator frequency, any circuit capable of generating a sawtooth or triangle wave can be used.

This generated waveform becomes the reference clock for the class D modulator when it is applied to the negative terminal of the PWM comparator 30. The output impedance of the reference clock generator, in this case the VCO integrator 10, must be low so that the feedback from R1 and R2 does not corrupt the waveform. When transmission gate TGATE 50 is open, the modulator functions is self oscillating variable frequency. When TGATE 50 is closed the modulator becomes a conventional fixed frequency triangle wave modulator. TGATE is only closed when used in conjunction with an AM radio. Thus, the amplifier realizes all of the benefits of self oscillation except in AM mode where the noise floor will become much higher.

Vc, the control voltage, is generated from conventional logic circuits (FIG. 2b) that are tied into the local oscillator of the AM radio. Algorithms can be implemented so that the spectrum of the amplifier does not interfere with the station that is being tuned. Techniques to generate a reference square wave by dividing down the local oscillator are described in my co-pending application, U.S. Ser. No. 09/342,376, filed Jun. 29, 1999. The clock generated by this division can be used to generate a triangle wave or it can be used to generate an error voltage to drive the VCO in FIG. 2A. FIG. 2b depicts these circuits. The advantage of the circuit in FIG. 2 is that it is a conventional class D amplifier in AM mode. Its frequency is locked to that of the reference triangle wave and it will not vary.

The circuit in FIG. 3 is designed to synchronize to a square wave. The square wave is applied directly to the summing junction of the integrator 20 through a high pass filter Csync and Rsync. The modulator integrator 20, 30 will attempt to close the loop and satisfy the requirement that the current into the summing junction must equal the current out and thus will lock onto the square. The modulator 30 will synchronize to the reference square wave. This circuit is much simpler than that shown in FIG. 2A as no triangle wave generator is needed. The AM avoidance clock can be generated by simply dividing down the local oscillator see my co-pending application, U.S. Ser. No. 09/342,376, filed Jun. 29, 1999.

The downside of the circuit in FIG. 3 is that at high powers the integrator may loose lock on the reference signal. Since AM radio is generally only voice, high power stereo amplifiers only use a fraction of their power in AM mode. Thus, the simplicity of this circuit lends itself well to these applications. This circuit is not acceptable for AM amplification at the full rated power of the amplifier.

The circuit is FIG. 4 is another way to achieve lock. The output of the PWM comparator 30 is divided by two in divider circuit 100 to make it a square wave. The low pass filter $R_{LP}C_{LP}$ creates a voltage Ve' that is proportional to this square wave. The differential amplifier 200 compares the Ve' voltage to a control voltage and then drives the gate of a NMOS 300 parallel with one of the resistors R2 that sets up the hysteresis in the PWM comparator 30. As the frequency falls the voltage at Ve' increases. This increases the bias on the gate of the NMOS which in turn decreases the hysteresis in the comparator. Since the slope of the integrator 20 is unchanged, the frequency is stabilized. The voltage at Vc controls the frequency of the modulator.

What is claimed is:

1. A self oscillating class D amplifier synchronized to an external clock comprising:

an integrator with a summing input for receiving inputs from an audio signal source and analog and digital feedback signals of the amplifier output;

a pulse width modulator for receiving the output of the integrator and a feedback signal representative of an output of the amplifier and generating a series of output pulses where the width of the pulses is proportional to the amplitude of the input audio signal;

a bridge comprising an upper mosfet and a lower mosfet;

level shift and gate drive circuitry coupled to the output of the pulse width modulator and to the gates of the mosfets for shifting the output level of the pulses and for driving the gates of the mosfets;

a digital output terminal coupled to the mosfets and an inductor and low pass filter coupled to the digital output for converting the digital output into an analog signal for driving a speaker; and a transmission gate coupled to the pulse width modulator for selectively connecting an external clock signal to the pulse width modulator for controlling the output frequency of the pulse width modulator in accordance with the external clock signal.

2. The class D amplifier of claim 1 wherein the external clock signal is either a fixed frequency less than a received amplitude modulated audio signal or is a clock signal generated by a voltage controlled oscillator.

3. The class D amplifier of claim 1 wherein the transmission gate is responsive to the audio input signal for connecting the external clock to the pulse width modulator when the audio input signal has an amplitude modulated signal.

4. A self oscillating class D amplifier synchronized to an external clock comprising:

an integrator with a summing input for receiving inputs from an audio signal source and analog and digital feedback signals of the amplifier output;

a pulse width modulator for receiving the output of the integrator and a feedback signal representative of an output of the amplifier and generating a series of output pulses where the width of the pulses is proportional to the amplitude of the input audio signal;

a bridge comprising an upper mosfet and a lower mosfet;

level shift and gate drive circuitry coupled to the output of the pulse width modulator and to the gates of the mosfets for shifting the output level of the pulses and for driving the gates of the mosfets;

a digital output terminal coupled to the mosfets and an inductor and low pass filter coupled to the digital output for converting the digital output into an analog signal for driving a speaker; and a high pass filter coupled to the summing input of the integrator and to a square wave source for adding a square wave to the integrator input and thereby synchronizing the pulse width modulator to the input square wave.

5. A self oscillating class D amplifier synchronized to an external clock comprising:

an integrator with a summing input for receiving inputs from an audio signal source and analog and digital feedback signals of the amplifier output;

a pulse width modulator for receiving the output of the integrator and a feedback signal representative of an output of the amplifier and generating a series of output pulses where the width of the pulses is proportional to the amplitude of the input audio signal;

a bridge comprising an upper mosfet and a lower mosfet;

level shift and gate drive circuitry coupled to the output of the pulse width modulator and to the gates of the mosfets for shifting the output level of the pulses and for driving the gates of the mosfets;

a digital output terminal coupled to the mosfets and an inductor and low pass filter coupled to the digital output for converting the digital output into an analog signal for driving a speaker; and a divider coupled to the output of the modulator and to the feedback signal of the modulator for converting the modulator output into a square wave.

6. The self oscillating class D amplifier amplifier of claim 5 further comprising a low pass filter coupled to the modulator output and a comparator coupled to the low pass filter for comparing the low pass filtered output of the modulator to a reference voltage, and a transistor with its gate coupled to the output of the comparator and its output coupled to the modulator for changing hysteresis of modulator in accordance with the output of the comparator.

* * * * *